United States Patent [19]

Yamazaki et al.

[11] Patent Number: 4,760,008
[45] Date of Patent: Jul. 26, 1988

[54] ELECTROPHOTOGRAPHIC PHOTOSENSITIVE MEMBERS AND METHODS FOR MANUFACTURING THE SAME USING MICROWAVE RADIATION IN MAGNETIC FIELD

[75] Inventors: Shunpei Yamazaki, Tokyo; Takeshi Fukada, Ebina, both of Japan

[73] Assignee: Semiconductor Energy Laboratory Co., Ltd., Kanagawa, Japan

[21] Appl. No.: 6,379

[22] Filed: Jan. 23, 1987

[30] Foreign Application Priority Data

Jan. 24, 1986 [JP] Japan .................................. 61-14573
Jan. 24, 1986 [JP] Japan .................................. 61-14574

[51] Int. Cl.⁴ .............................................. G03G 5/82
[52] U.S. Cl. .................................... 430/127; 430/133; 430/134; 430/135; 427/38; 427/39; 427/45.1; 427/47

[58] Field of Search ............... 430/128, 130, 127, 133, 430/134, 135; 427/39, 38, 45.1, 47

[56] References Cited

U.S. PATENT DOCUMENTS 4,532,199 7/1985 Ueno et al. .................... 430/133 X Primary Examiner—J. David Welsh
Attorney, Agent, or Firm—Gerald J. Ferguson, Jr.

[57] ABSTRACT

A photosensitive layer is deposited by chemical vapor deposition which is enhanced both by microwave and magnetic field. The microwave and the magnetic field are cooperating in exciting a process gas. At first, the pressure in a resonating chamber is set at a low pressure in which electron cyclotron resonance. Next the pressure is increased to a level at which the process gas is excited in hybrid resonating action.

6 Claims, 2 Drawing Sheets

ELECTROPHOTOGRAPHIC PHOTOSENSITIVE MEMBERS AND METHODS FOR MANUFACTURING THE SAME USING MICROWAVE RADIATION IN MAGNETIC FIELD

BACKGROUND OF THE INVENTION

This invention relates to electrophotographic photosensitive members and methods for maufacturing the same, more particularly relates to an application of microwave enhanced CVD.

From the state of the art it is known to utilize plasma enhanced CVD (glow discharge CVD) in which process gas is excited by high frequency or direct electric field, for fabricating thin film on a printing drum. This prior art method is advantageous in that deposition can be performed at a low temperature in comparison with conventional thermal CVD. Particularly, in deposition of such as amorphous silicon semiconductor, it is possible to add hydrogen or a halogen in the semiconductor to neutralize recombination centers according to this method.

The deposition speed of the glow discharge CVD, however, is very slow, 1 to 3 21 for example, so that it is demanded to increase the speed by a factor to 10 to 500 for commertializing the method. In addition, the method tends to give rise to coming off and cracks of a film deposited with only about one micron in thickness when having used for a time or having underwent temperature charges. Also degradation due to light irradiation has been observed on a film whose thickness is more than about 0.5 micron. When the thickness further increases during deposition, localization of electrical field takes place on the deposition surface and thereby the deposition is partially enhanced at the localized position of the surface to a thickness of 2 to 10 microns resulting in an uneven surface. Because of this, an improved method has been demanded to form an even layer at a low temperature lower than 300° C. with 2 to 10 microns in thickness.

SUMMARY OF THE INVENTION

An object of the invention is to provide an improved electrophotographic photosensitive member with high reliability.

Another object of the invention is to provide an improved electrophotographic photosensitive member having a long life.

A further object of the invention is to provide an improved electrophotographic photosensitive member capable of enduring external action.

A still further object of the invention is to provide a method for manufacturing the above improved electrophotographic photosensitive member with high reliability.

An yet still further object of the invention is to provide a method for manufacturing the above improved electrophotographic photosensitive member with a great thickness at a short procesing time.

To accomplish the above objects, cooperative enhancement of process gas by microwave and magnetic field is used. The process gas is decomposed or desociated in a very efficiently under resonance taking place between microwave and magnetic field. Once excited, the process gas is expected to reach, holding its energy, the vicinity of a surface where deposition is carried out. By virtue of the efficient excitation system, a very high deposition speed is available, 20 to 100 Å for example.

BREIF DESCRIPTION OF THE DRAWINGS

DETAILED DESCRIPTION OF THE PREFERRED EMBODIMENTS

Figure 1:
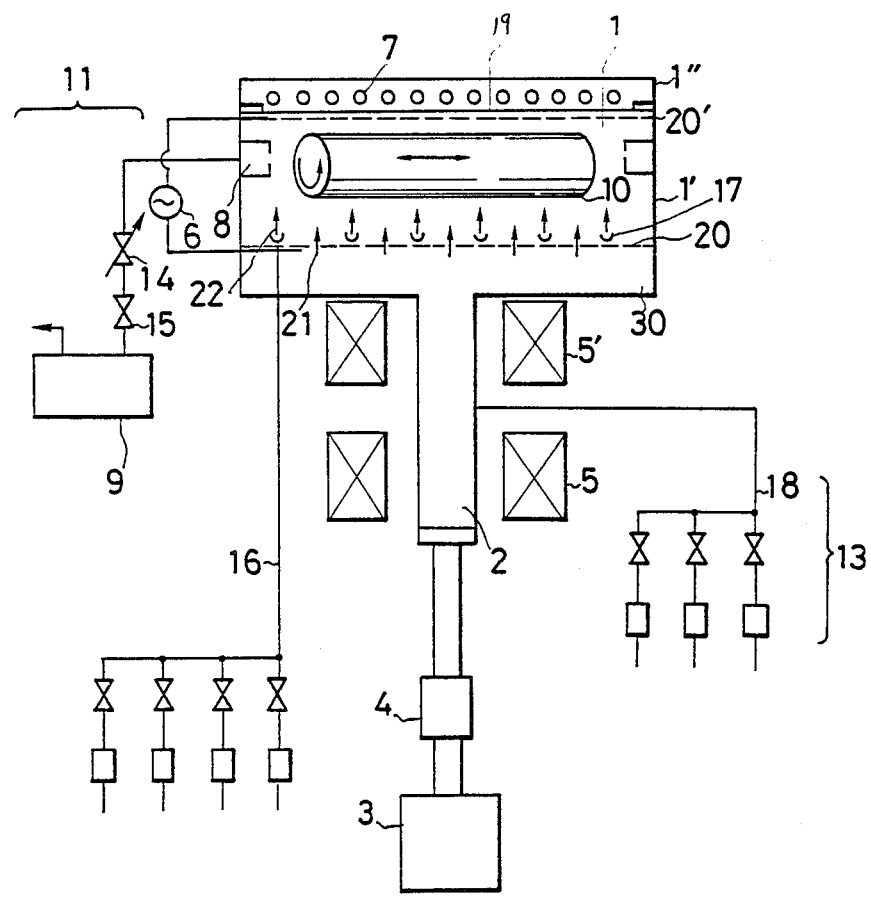
FIG. 1 is a section view showing an ECR CVD system according to the invention.

Referring to FIG. 1, a microwave enhanced CVD system for the invention is illustrated. In the figure, a reaction chamber 1' of stainless steel is provided with a rid 1" to define a reaction space 1 therein. A printing drum 10 is rotatably supported by a holder 10' in the reaction chamber 1. To irradiate and heat the drum 10 by irradiation, a halogen lamp heater 7 is provided in the rid 1" which can be detached from the reaction chamber to provide an access to the inside of the reaction chamber when taking out or in of the drum 10 is desired. The drum 10 is heated by infrared light passing through an artifitial quartz window 19 from the halogen lump heater 7. Between the drum 10 and the halogen lamp 7 is a meshed electrode 20' and below the drum 10 is an opposed meshed electrode 20. High frequency (13.56 MHz) or direct electric field is applied between the meshed electrodes 20 and 20' by means of a power supply 6. The drum 10 is placed along the direction perpendicular to the direction of the electric field and can be rotated around its center line.

A nonproductive gas is introduced into a resonating space 2 defined by a quartz tube via a line 18 from a doping system 13. The resonating space 2 is subjected to a magnetic field by means of core-less coils 5 and 5' which are provided around the quartz tube with its maximum output of 2K gauss. Simultaneously a microwave having a frequency of 2.45 GHz is radiated into the resonating space 2 from a microwave oscilator through an isolator 4. The frequency of the microwave and the strength of the applied magnetic field are determined according to the resonating relationship therebetween. In a case when argon gas is utilized as a process gas, the strength of the magentic field is chosen 875 Gauss for example.

In such suitable condition of the system, argon gas is pinched by the applied magnetic field and resonating with the microwave and exciting gas composed of electrons and argon gas is introduced into the reaction space. The meshed electrode 20 also functions as a homogenizer in the reaction space. Namely the electrode 20 allows the excited gas to flow uniformly after passing through the meshes of the electrode 20. In the downstream of the electrode 20 are located a plurality of ring-shaped nozzles 17 through which a productive gas is introduced into the reaction chamber. Consequently the productive gas is excited by the nonproductive gas during mixing. In addition to this, electric field applied from the electrodes 209 and 20' helps to enhancen further the excitation of the productive gas.

Even though the distance between the reaction space and the resonating space is somewhat large, 5 to 20 cm for example, the exciting condition of the nonproductive gas is maintained sufficiently.

A pressure range of 1 to $10^{-4}$ torr, for example, 0,03 to 0.001 torr in the reaction space and the resonatiing space is available to enable the process gas to spread sufficiently throughout the reaction chamber, and enable the microwave and the magnetic field to cooperate in a synergetic action. The pressure is maintained by adjusting a control valve 14 of an exhaust system 11 to regulate the exhaust rate of a vacuum pump 9 in cooperation with a turbo pump.

Although making the configuration of the electrode 20 in the form of a homogenizer is advantageous in that gas passing through the meshes of the homogenizer and the productive gas can be mixed over a broad region in the vicinity of the drum 10, the homogenizer reduces the energy of the excited nonproductive gas by collision therewith so that provision of such a homogenizer tends to lower the deposition to some extent. In the case where a high deposition speed is preferred to the uniformity of the deposited layer, the homogenizer can be dispensed with.

EXPERIMENT 1

This experiment was made to deposit an amorpous silicon layer on a substrate according to the first embodiment of the invention.

As a nonproductive gas, argon gas was introduced to the resonating space 2 at 0.003 torr through the line 18 at a rate of 20 SCCM. The microwave oscilator 3 was adjusted to produce microwave of 2.45 MHz with power supply of 30 to 500 W, 50 W for example. The strength of the magnetic field was 875 Gauss. On the other hand monosilan gas were introduced at 10 SCCM into the reaction space 1.

On a surface of the drum 10 which is at least partially coated with conductive transparent film, amorphous silicon semiconductor layer is deposited as non-single-crystalline semiconductors. Unnecessary gas was being exhausted through the doposition speed of 45 Å/sec on the substrate 10 of which the temperature is maintained at a temperature of 250° C. This speed is 30 times as high as obtained by a known plasma CVD alone, 1.5 Å/sec. It takes about 18 minutes to complete the deposition. Then, electrical characteristics of this amorphous silicon layer were measured. The dark conductivity was $2\times10^{-10}$ Scm$^{-1}$. The photo conductivity was $7\times10^{-5}$ Scm$^{-1}$ under irradiation of light with a power supply of 100 mW/cm$^2$ (AM1). The figures are not worse than obtained so far by a known plasma CVD. When the amorphous silicon layer was fabricated in the form of a photoelectric conversion device, a high conversion efficiency was obtained.

Further a semiconductor layer was deposited to a 1 micron meter thickness. On the layer were observed a number of pinholes of 0.1 to 0.01 micron meter in diameter. The number of the pinholes has been substantially reduced by a factor of 10 in comparison with prior art. According to the invention, only 1 to 3 pinholes were observed in a view of dark field with an electron microscope adjusted at a 100 times magnification.

Figure 2:
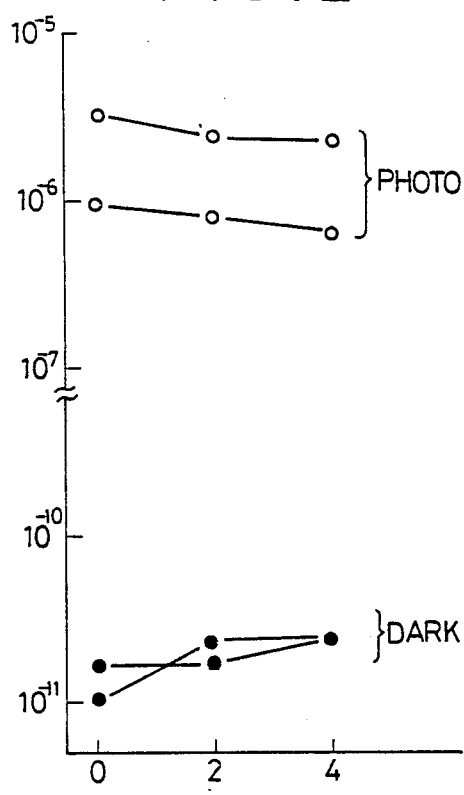
FIG. 2 is a graphical diagram showing dark and photo conductivityies of the device according to the invention.
Figure 3:
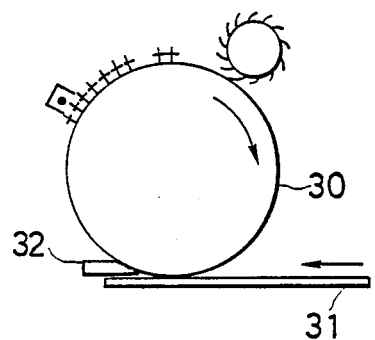
FIG. 3 is a partial side view of a copying machine in which is provided a photosensitive member of the invention.

FIG. 2 is a graphical diagram showing the electric conductivity of the layer in response to light irradiation. The ordinate is conductivity (Scm$^{-1}$) and the abscissa is time (hour). In spite of such a thickness as about one micron, the semiconductor layer did not become degraded even after irradiation (100 mW/cm$^2$ under AM1) for four hours unlike prior art.

When disilane gas or mixture of monosilane gas and silane fluoride (Si$_2$F$_6$) was introduced into the reaction space in place of monosilane alone, the deposition speed was further increased.

EXPERIMENT 2

In this experiment a cylinder with 30 cm in length and 25 cm in diameter was used for a photosensitive drum. The periphery of the cylinder is coated with aluminium or a compound thereof. The cylinder was disposed in the reaction space at $3\times10^{-3}$ torr. Argon gas was introduced from the line 18 at 20 SCCM. Also SiH$_4$ gas and B$_2$H$_6$ were introduced from the line 16 at 10 SCCM and at 0.2 SCCM respectively. Then a p-type non-single-crystalline silicon semiconductor layer was formed with 700 Å in thickness by means of the electric power supply for plasma discharge (13.56 MHz, 30W) under magnetic field (875 gauss) in cooperation with 2.45 GHz magnetic radiation of 50 W. The thickness of the p-type semiconductor layer may be in a range of 500 to 2000 Å instead. After the formation, the inside of the reaction chamber was exhausted to remove gaseous residue from the chamber.

Next, argon gas and SiH$_4$ were introduced again at 25 SCCM and at 15 SCCM respectively to form an intrinsic non-single-crystalline semiconductor layer with 5 microns in thickness on the p-type semiconductor layer. The thickness of the intrinsic layer may be 2 to 10 microns instead. The other preparation condition was same as that of the p-type semiconductor layer so that redundant explanation will not be repeated.

Further, a Si$_3$N$_{4-x}$ ($0 \leq X < 4$) layer was formed as a passivation film on the intrinsic semiconductor layer. The formation of this layer was carried out under the preparation condition of the intrinsic semiconductor layer, besides which ammonia gas was also introduced at 50 SCCM. The thickness of the passivation film may be on the order of hundred. In the experiment the thickness was 200 Å. It took about half hour to complete the formation of the above three layers.

EXPERIMENT 3

A photosensitive semiconductor similar to the product of the Experiment 1 was formed with an enhancement by cyclotron resonance alone. The preparation condition was same as that of the Experiment 1. In this process which did not resort electrical enhancement in the reaction chamber, the drum 10 was let reciprocate in axial dirction during rotation since there were some difficulties in deposition on a large area without enhancement in the reaction chamber. To evaluate the reliability three hundred samples prepared as this experiment were subjected to one hundred cycles of temperature change between a room temperature and 150° C. As a result, conforming article remain at about 98% of the smaples. Among the samples two got layers come off and five cracked. By virtue of this high reliability, it became possible to place a squeege 32 proximately close to the drum in a copying machine to make a paper 31 certainly separated from the drum at a proper position without peeling the photosensitive layer from the drum. No trouble arose after $10^4$ to $10^6$ times copyings.

What follows is description of a second embodiment of the invention relavent to a further improvement on microwave enhanced CVD.

According to the second embodiment of the invention, process gas is excited by synergetic resonance rather than by exact electron cycotron resonance alone. The inventors have discovered that, even at relatively high pressure as $1\times10^{-2}$ to 300 torrs, a cooperative action among microwave, magnetic field and plasma gas is available in synergetic resonace where process gas in the form of plasma is excited.

Under the high pressure in a process chamber, excitation, decomposition and chemical reaction can be carried out very efficiently due to a large amount of process chemicals per unit space, $10^3$ to $10^5$ times as much as that of the first embodiment.

Further, according to the second embodiment, the mean free path of process gas is shortened by a factor of 10 to $10^4$ and thereby the product is very finely deposited even on a side of uneven surface. When synergetic resonance is established at $5 \times 10^{-2}$ to $5 \times 10^{-4}$ torr, glow discharge is used at dc or high frequency (13.56 MHz for example) in combination therewith.

The deposition condition of the second embodiment is largely same as that of the first embodiment. Only the pressure in the reaction chamber and the resonating chamber differs. In general, the pressure is chosen, at first, very low to establish electron cyclotron resonance and then the pressure is raised in order to enjoy the advantages of high pressure under synergetic resonance.

EXPERIMENT 4

This experiment was made to deposit an amorphous silicon layer on a substrate according to the first embodiment of the invention.

As a nonproductive gas, argon gas was introduced to the resonating space 2 at 0.003 torr through the line 18 at a rate of 20 SCCM. The microwave oscillator 3 was adjusted to produce microwave of 2.45 MHz with power supply of 30 W to 1.3 KW, 500 W for example. The strength of the magnetic field was 875 Gauss. On the other hand monosilan gas were introduced at 10 SCCM into the reaction space 1. After starting discharge, the exhaust rate was under control and the flow process gas was continuously changed to 100 SCCM of monosilane and 200 SCCM of argon eventually raising the pressure to 3 torrs.

On a surface of the drum 10 which is at least partially coated with conductive transparent film, amorphous silicon semiconductor layer is deposited as non-single-crystalline semiconductors. Unnecessary gas was being exhausted through the exhaust system 11. As a product, a layer was formed at a doposition speed of 230 Å/sec on the substrate 10 of which the temperature is maintained at a temperature of 250° C. This speed is 150 times as high as obtained by a known plasma CVD alone, 1.5 Å/sec. It takes about 15 minutes to complete the deposition. Then, electrical characteristics of this amorphous silicon layer were measured. The dark conductivity was $2 \times 10^{-8}$ Scm$^{-1}$. The photo conductivity was $7 \times 10^{-4}$ Scm$^{-1}$ under irradiation of light with a power supply of 100 mW/cm$^2$ (AM1). The figures are not worse than obtained so far by a known plasma CVD. When the amorphous silicon layer was fabricated in the form of a photoelectric conversion device, a high conversion efficiency was obtained.

Further a semiconductor layer was deposited to 5 microns thickness. On the layer were observed a number of pinholes of 0.1 to 0.01 micron meter in diameter. The number of the pinholes has been substantially reduced by a factor of 10 in comparison with prior art. According to the invention, only 1 to 3 pinholes were observed in a view of dark field with an electron microscope adjusted at a 100 times magnification. In spite of such a thickness as about 5 microns, the semiconductor layer did not become degraded even after irradition (100 mW/cm$^2$ under AM1) for four hours unlike prior art. The deterioration in conductivity due to light irradiation was about half in comparison with prior art.

When disilane gas or mixture of monosilane gas and silane fluoride ($Si_2F_6$) was introduced into the reaction space in place of monosilane alone, the deposition speed was further increased.

EXPERIMENT 5

In this experiment a cylinder with 30 cm in length and 25 cm in diameter was used for a photosensitive drum. The periphery of the cylinder is coated with aluminum or a compound thereof. The cylinder was disposed in the reaction space at 3 torrs. Argon gas was introduced from the line 18 at 20 SCCM. Also SiH$_4$ gas and B$_2$H$_6$ were introduced from the line 16 at 10 SCCM and at 1.5 SCCM respectively. Then a p-type non-single-crystalline silicon semiconductor layer was formed with 700 Å in thickness by means of the electric power supply for plasma discharge (13.56 MHz, 30W) The thickness of the p-type semiconductor layer may be in a range of 500 to 2000 Å instead. After the formation, the inside of the reaction chamber was exhausted to remove gaseous residue from the chamber.

Next, in accordance with a synergetic resonance method, argon gas and SiH$_4$ gas were introduced into the reaction chamber at 25 SCCM and at 15 SCCM respectively at a chamber pressure of $3 \times 10^{-3}$ torr and electron cyclotron resonance was established with auxiliary discharge. Then the chamber pressusre was changed upto 3 torrs to make a synergetic resonance in which an intrinsic silicon semiconductor layer with 5 microns (2 to 4 microns in general) on the p-type semiconductor layer. The output power of 2.45 GHz microwave was 200 W and the strength of magnetic field was 875 gauss. The power supply to the magnetic coil was controlled in such a way that the maximum cooperating action between the magnetic field and the microwave was accomplished in the synergetic resonance. Further introduced into the reaction chamber was SH$_4$ gas (also oxygen, carbon and/or nitrogen at 0.1 to 5% or born at 0.0001 to 0.01 may be added if desired). The deposition speed was 250 Å/sec which was suitable for forming a 5 microns thickness. The deposition time for complete the formation of the layer, however, was totally 15 minutes since the drum must be shifted in the reaction chamber to make a uniform layer.

Further, a $Si_3N_{4-x}$ ($0 \leq X < 4$) layer was formed as a passivation film on the intrinsic semiconductor layer. The formation of this layer was carried out under the preparation condition of the intrinsic semiconductor layer, besides which ammonia gas was also introduced at 50 SCCM. The thickness of the passivation film may be on the order of hundred. In the experiment the thickness was 200 Å. It took about half hour to complete the formation of the above three layers.

EXPERIMENT 6

A photosensitive semiconductor similar to the product of the Experiment 1 was formed with an enhancement by synergetic resonance alone. The preparation condition was same as that of the Experiment 1. In this process which did not resort electrical enhancement in the reaction chamber, the drum 10 was let reciprocate in the axial direction during rotation since there were some difficulties in deposition on a large area without enhancement in the reaction chamber. To evaluate the reliability three hundred samples prepared as this experiment were subjected to one hundred cycles of temperature change between a room temperature and 150° C. As a result, conforming article remain at about 98% of the samples. Among the samples, one got layers coming off and two cracked. By virtue of this high reliability, it became possible to place a squeege 32 proximately close to the drum in a copying machine to make a paper 31 certainly separated from the drum at a proper position without peeling the photosensitive layer from the drum. No trouble arose after $10^4$ to $10^6$ times copyings.

While the description is made in conjunction with particular embodiments, the present invention is not limited to those but many modifictions and variations may occur to skilled person in the art. The followings are some examples of such modifications.

In the above embodiment, the photosensitive drum is disposed with its axial direction prependicular to the electric field. The drum, however, may be placed and rotated its axis parallel to the electric field, especially when a number of drums are desired to be treated at once.

Although argon gas is employed to be subjected in the resonance, other gas can replace it, for example, inert gas such as helium, neon and klipton, nitrogen gas such as $N_2$, $NH_3$, $N_2H_4$, $NF_3$, $N_2F_6$, oxide gas such as $O_2$, $N_2O$, $NO$, $NO_2$, $CO$, $CO_2$ and $H_2O$. and those diluted with a carrier gas.

Also other productive gas to be introduced into the reaction chamber is used, for example, a silicide gas such as $SinH_{2n+2}$ ($n \geq 1$), $SiFn$ ($n \geq 2$) or $SiHnF_{4-n}$ ($1 \leq n \leq 4$), a germanium compound such as $GeH_4$, $GeF_4$ or $GeHnF_{4-n}$ ($n = 1,2,3,4$), an aluminium compound such as $Al(CH_3)_3$, $Al(C_2H_5)_3$, $Al(C_2H_5)_3$, a tin compound such as $SnCl_4$ or $Sn(CH_3)_4$, an indium compound such as $InCl_3$ or $In(CH_3)_3$, an antimony compound such as $SbCl_3$ or $Sb(CH_3)_3$, and $Ga(CH_3)_3$ or $Ga(C_2H_5)_3$. In addition to this, a doping gas may be added as an additive gas such as $B_2H_6$, $BF_3$, $AsH_3$ or $PH_3$ to fabricate an impurity semiconductor layer.

What is claimed is:

1. A method for forming a photosensitive layer on a printing drum comprising:
   disposing said printing drum in a reaction chamber;
   rotating the printing drum about its axis;
   exciting a reaction gas in a reaction chamber which communicates with said reaction chamber by a microwave irradiation in a magnetic field;
   directing the exciting reaction gas from said resonating chamber into said reaction chamber;
   depositing the product of said reactive gas; and
   dividing said reaction chamber into two regions with an homogenizer, one region being interposed between said resonating chamber and said reaction chamber and receiving the exciting reactive gas from said resonatiing chamber and expanding it therein, the other region accommodating said drum, receiviing the expanded exciting reactive gas from said one region through said homogenizer and exposing said drum to said exciting reactive gas over the whole length of the drum to be coated.

2. A method of claim 2 where said homogenizer is an electrode and providing a further electrode on the side of said drum opposite to the side where the homogenizer is disposed to establish an electric field between the homogenizer and the further electrode for aiding the formation of the photosensitive layer.

3. The method of claim 1 wherein said non-reactive gas is argon gas.

4. The method of claim 1 wherein said reactive is a silane gas.

5. The method of claim 1 where said homogenizer is a meshed electrode.

6. The method of claim 1 where the dimension of the opening of said resonating chamber into said reaction chamber in the direction of the axis of the printing drum is substantially less than the length of the printing drum.

* * * * *